(12) United States Patent
Van Zanten

(10) Patent No.: US 6,470,084 B1
(45) Date of Patent: Oct. 22, 2002

(54) CURRENT AMPLIFIER, PARTICULARLY FOR A TELEPHONE LINE

(75) Inventor: François Van Zanten, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/158,652

(22) Filed: Sep. 22, 1998

(30) Foreign Application Priority Data

Sep. 24, 1997 (FR) .............................................. 97 11873

(51) Int. Cl.[7] .................................................. H04M 9/08
(52) U.S. Cl. .................................. 379/413; 379/413.01
(58) Field of Search ............................ 379/413, 413.01; 330/297

(56) References Cited

U.S. PATENT DOCUMENTS

| | | | |
|---|---|---|---|
| 3,999,139 A | | 12/1976 | Fennell |
| 4,267,519 A | * | 5/1981 | Schade, Jr. ................ 330/288 |
| 5,075,634 A | * | 12/1991 | French ....................... 330/297 |
| 5,440,261 A | | 8/1995 | Rydel |
| 5,450,038 A | | 9/1995 | Rydel |
| 5,459,434 A | | 10/1995 | Liger et al. |

\* cited by examiner

*Primary Examiner*—Forester W. Isen
*Assistant Examiner*—Jefferey Harold
(74) *Attorney, Agent, or Firm*—Lisa K. Jorgenson; Allen, Dyer, Doppelt, Milbrath & Gilchrist, P.A.

(57) ABSTRACT

A telephone line current amplifier comprises a current amplifying device comprising a first, second and third amplifier connected in cascade. The current from the third amplifier forms the output current of the current amplifying device. The current from the first amplifier subtracts from the current provided by the third amplifier, and the current from the second amplifier operates as a rectifier and outputs its current onto a power supply terminal. The power supply terminal is decoupled from ground via a capacitor. Another embodiment of the telephone line current amplifier comprises only two amplifiers if less severe distortion ratios are imposed.

36 Claims, 4 Drawing Sheets

CURRENT AMPLIFIER, PARTICULARLY FOR A TELEPHONE LINE

FIELD OF THE INVENTION

This invention relates to amplifiers, and more particularly, to a current amplifier for a telephone line. The invention is particularly applicable for making a line amplifier part of an integrated circuit providing coupling between a MODEM and a telephone line.

BACKGROUND OF THE INVENTION

In known devices in the prior art, a telephone line transformer is used to isolate a telephone line from the outside world. However, this is both cumbersome and expensive since the transformer must be extremely linear and have an isolating voltage of several thousands volts. A second approach according to the prior art is to use optocouplers, for which the linearity has been improved by complex electronic devices. These devices are expensive and consume electrical energy, which is very limited on a telephone line.

A third approach consists of using a transformer to transfer the power supply from an external source. Again, this approach is expensive since a transformer and a DC/DC converter have to be added. A fourth approach known in the prior art consists of powering the MODEM directly on the telephone line. This approach has a disadvantage in that the power supply voltage varies with the line modulation, hence the need to have a very good power supply rejection of the analog parts powered directly by the line (A/D and D/A converters). In addition, the consumed current must be very strictly controlled so that it does not disturb or create harmonics or noise on the telephone line so that an anti-echo device can fulfill its role, which excludes CMOS type logic circuits.

The first two approaches are based on an analog transfer of data between the telephone line and the outside world. The last two approaches incorporate D/A and A/D converters at the telephone line end so that the transfer is done digitally. This eliminates the linearity requirements for the insulation barrier between the telephone line and the outside world. Therefore, optical barriers, transformers or even compact and inexpensive capacitors can be used.

However, there is a need for powering converters from the telephone line without disturbing the line with distortion or noise. Finally, devices according to the prior art cannot be utilized on a long telephone line (i.e., 4–8 km), and are not compatible with high throughput transmission modes (i.e., V34).

SUMMARY OF THE INVENTION

An object of this invention is to provide a current amplifier for a telephone line capable of taking electrical energy from the telephone line to power logical and analog functions for processing MODEM transmissions and reception signals. This includes D/A and A/D converters and other telephone functions defined by industry standards (i.e., continuous characteristic, impedance summary, anti-echo).

The current amplifying device comprises first and second amplifiers installed in cascade. The second amplifier functions as a voltage follower to the first amplifier. That is, current from the second amplifier is subtracted from the current in the first amplifier. The second amplifier also functions as a rectifier or as a rectifying amplifier.

In this device, the second amplifier acts as a rectifier and the first amplifier filters harmonics generated by the second amplifier. If applied to a telephone line, the first amplifier uses the line itself as a power supply source, and the second amplifier functions as a rectifier and uses the first amplifier as a power supply source.

If the harmonic content obtained is not sufficiently low for the planned application, a third amplifier is added. The third amplifier is also installed as a voltage follower so that the current in the first amplifier originates from this third amplifier, or is subtracted from the current in this third amplifier. When applied to a telephone line, the third amplifier uses the line itself as its source. The first amplifier uses the third amplifier as its source and the second amplifier acts as a rectifier using the first amplifier as its source. This circuit gives a very low harmonic content, and satisfies the most demanding applications.

Amplifiers with a gain-bandwidth product better than 10 MHz and an open loop gain exceeding 60 dB, are capable of providing a harmonic content of less than −100 dB on a telephone line to which the device according to the invention is connected. Furthermore, if the minimum operating voltage of each of the amplifiers is less than a few volts (i.e., 1.8 or 2 V), the device is capable of operating with a much lower line voltage than devices disclosed in the prior art.

According to one particular embodiment, the second amplifier shunts its output current on a power supply terminal through a MOS transistor. The second amplifier also comprises means for blocking this transistor and enabling it to operate as a rectifier, or a differential amplifier, the output of which controls the gate of the MOS transistor. The source of this MOS transistor is connected to an input of the differential amplifier. Furthermore, means may be provided to bias the body of the MOS transistor at its source when its source and drain electrodes are subsequently swapped as a result of polarity inversions due to operation as a rectifier.

According to one embodiment, the second amplifier shunts its output current on a power supply terminal through a MOS transistor and comprises a differential amplifier followed by another differential amplifier, the output of which controls the gate of the MOS transistor. The source of this MOS transistor is connected to the inverting input of the differential amplifier. Also included are means of blocking the MOS transistor and making the second amplifier operate as a rectifier, and means of correctly biasing the MOS transistor body when its source and drain electrodes are swapped as a result of polarity inversions due to operation as a rectifier. The first amplifier and possibly the third amplifier may include a differential amplifier, a transistor installed as a common emitter, and a voltage follower device.

The invention is particularly applicable to manufacture of a telephone installation device, such as a device like that described above connected to a telephone line. In this case, the device or circuit according to a particular embodiment comprises an input terminal E into which an input current $I_E$ is applied, an output terminal S that absorbs the current $I_L$ from a telephone line, and a third terminal for outputting a power supply voltage $V_{CC}$ and current $I_{CC}$. This circuit also includes a first and second amplifier installed in cascade as voltage followers, each amplifier comprising a resistance at the input ($R'_1$, $R'_2$) and a resistance at the output ($R_1$, $R_2$). The resistances $R'_1$ and $R'_2$ are connected in series and carry the input current $I_E$. The current gain in each of the amplifiers is determined by the ratios $R'_1/R_1$ and $R'_2/R_2$ and the current in the second amplifier is subtracted from the output current in the first amplifier. The output current $I_L$ is kept proportional to the input current $I_E$ (it is equal to the ratio $R'_1/R_1$), and the second amplifier acts as a rectifier. Its current $I_{CC}$ is limited by the fraction of the output current $I_L$, determined by resistance ratios $R'_1/R_1$ and $R'_2/R_2$.

The device or circuit can also comprise a third amplifier installed as voltage follower and in cascade with the two previous amplifiers. This amplifier comprises a resistance at the input $R'_0$ and a resistance at the output $R_0$. The resistances $R'_0$, $R'_1$ and $R'_2$ are installed in series and carry the input current $I_E$. The current gain in this third amplifier is determined by the ratio $R'_0/R_0$ and the first and second amplifier currents are subtracted from the current in this third amplifier. The output current $I_L$ is still kept proportional to the input current $I_E$ ($R'_0/R_0$ ratio).

Another object of the invention is an integrated circuit comprising a device like that described above.

BRIEF DESCRIPTION OF THE DRAWINGS

In any case, the characteristics and the advantages of the invention will be more obvious by reading the following description. This description relates to example embodiments, given by way of example, and is in no way restrictive with reference to the attached drawings, in which.

DETAILED DESCRIPTION OF THE PREFERRED EMBODIMENTS

Figure 1:
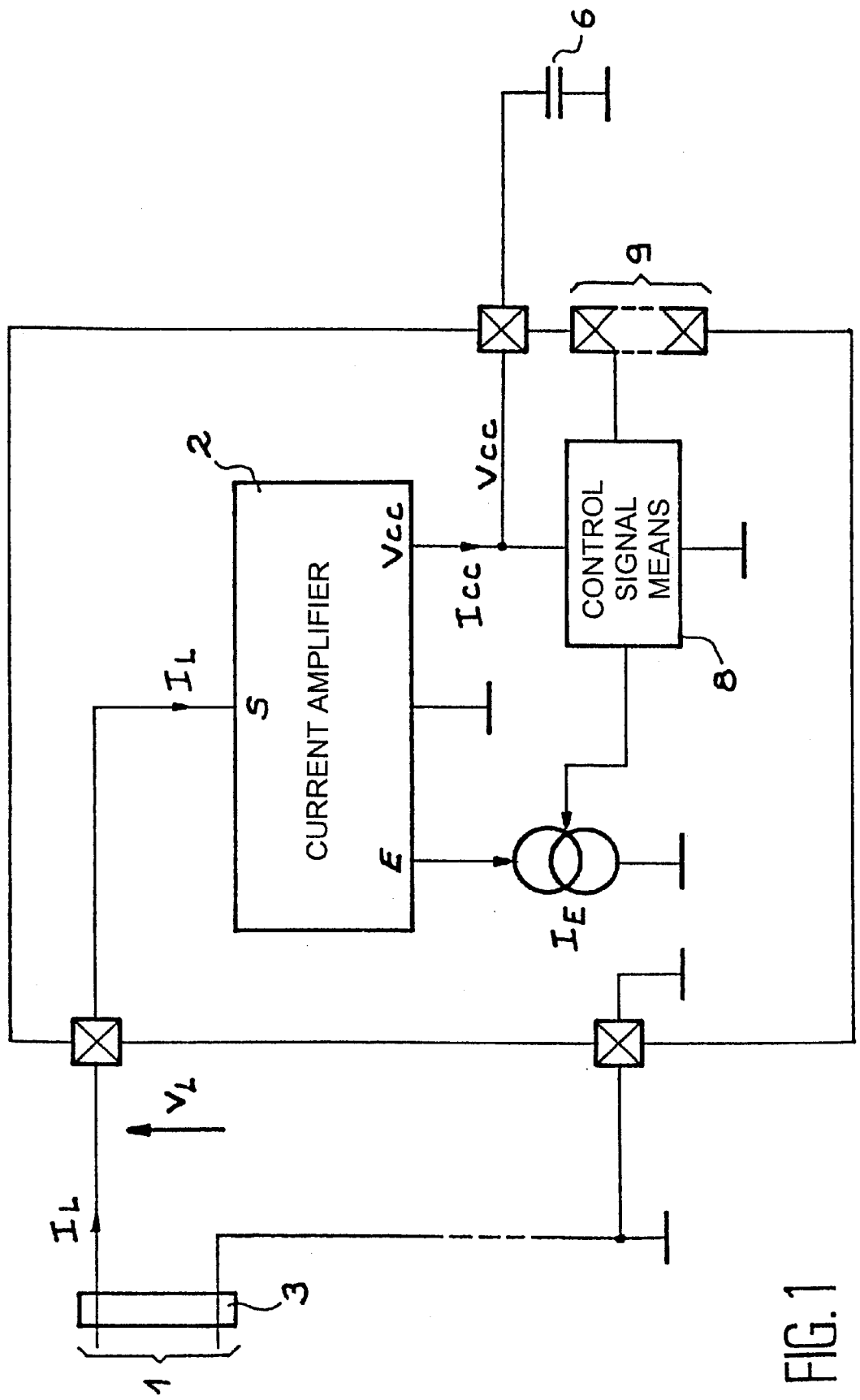
FIG. 1 is a schematic view of a device according to the invention.

FIG. 1 shows the role played by the invention for a telephone line. This figure shows an integrated circuit comprising part 2 (a current amplifier), the subject of the invention, and part 8 (control signal means) for outputting the control signal for part 2.

The line amplifier, the subject of the invention, includes a current amplifier 2 which receives a current $I_E$ on its input E, and outputs on telephone line 1 current $I_L$ at output S. In this case, the line voltage $V_L$ is positive with respect to ground. The current $I_L$ may be the superposition of a DC current, typically between 10 mA and 100 mA, and an AC current representing a signal to be received and/or transmitted. The gain $I_L/I_E$ of this amplifier is fixed, for example at 40. The current $I_E$, which determines $I_L$, may, for example, be a weighted sum of currents corresponding to the transmission/reception modulation, the combined impedance, the duplexer, and the DC characteristics. All these components may vary depending on the standards to be followed. This current is generated by control signal means 8, comprising D/A and A/D converters. These means 8 are themselves linked to various inputs-outputs 9 for various functions. These inputs-outputs 9 are digital, thus enabling a low cost isolation barrier.

Reference 3 refers to a set of components that may be present between line 1 and a user. The current amplifier 2 comprises a second DC voltage output $V_{CC}$ designed to supply the integrated circuit power supply current $I_{CC}$, particularly for part 8. This power supply voltage may be decoupled by a capacitor 6 to reduce ripple. Thus, capacitor 6 charges on positive peaks of the line voltage and discharges during negative peaks, thus smoothing the power supply current $I_{CC}$.

During positive peaks, the pulsed charge of the capacitor 6 produces current variations with a rich harmonic content, which must not appear on the line 1. The line amplifier according to the invention prevents these undesirable effects. In particular, it avoids noise created by consumers on the power supply $V_{CC}$, particularly switching noise, from being transmitted on the line 1.

Figure 2:
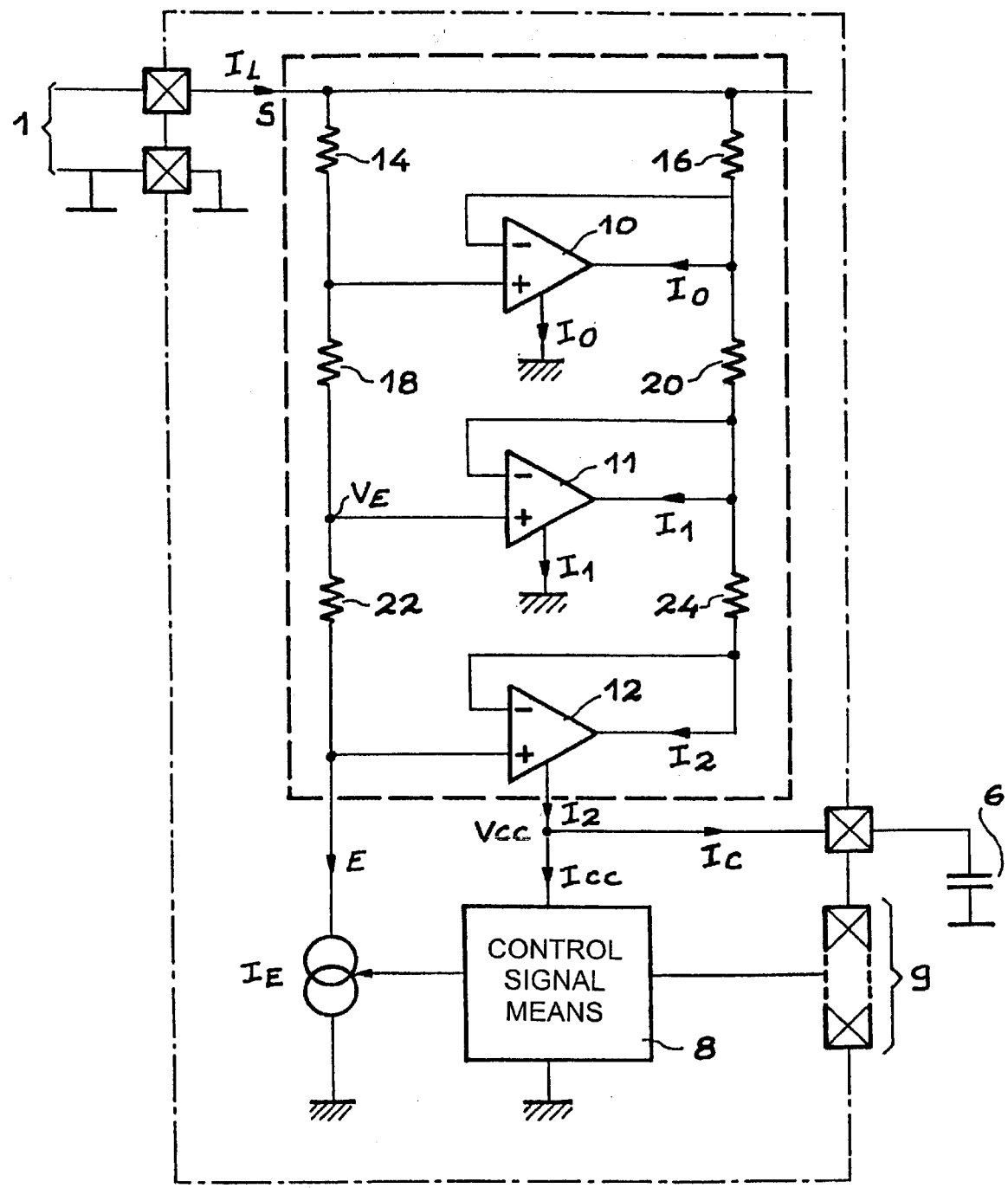
FIG. 2 schematically represents elements of the device according to the invention.

As shown in FIG. 2, the current amplifier according to the invention may comprise three amplifiers, 10, 11 and 12 connected in cascade, each itself being connected as a voltage follower. The amplifier 11 output current is subtracted from the amplifier 10 output current, and the amplifier 12 output current is subtracted from the amplifier 11 output current. The amplifier 10 output current is taken from line 1. Another embodiment described later uses only two amplifiers.

Each amplifier comprises an input resistance 14 ($R'_0$), 18 ($R'_1$), 22 ($R'_2$) through which a current $I_E$ passes, and which has a corresponding output resistance 16 ($R_0$), 20 ($R_1$), 24 ($R_2$). Resistances 14 and 16 are connected to the output S. For amplifier 10, the ratio $R'_0/R_0$ between the values of the resistances 14 and 16 is $K_0$. For amplifier 11, the ratio $R'_1/R_1$ between the values of the resistances 18 and 20 is $K_1$. For amplifier 12, the ratio $R'_2/R_2$ between the values of the resistances 22 and 24 is $K_2$. Thus, the current gains on each of the amplifiers are respectively $K_0$, $K_1$, $K_2$.

The amplifier 10 absorbs current in the amount by which its output current exceeds the output current of amplifier 11, and carries it to the ground. Similarly, amplifier 11 absorbs current in the amount by which its output current exceeds the output current from amplifier 12 and carries it to the ground, whereas amplifier 12 outputs its entire output current to terminal $V_{CC}$. The current gain of the current amplifier circuit remains constant and is determined by the current gain of amplifier 10 (in fact, equal to the current gain of amplifier 10).

The amplifier 12 operates intermittently (it is blocked and then conducting), unlike amplifiers 10 and 11 which operate continuously. If the input voltage $V_E$ to amplifier 12 exceeds the voltage $V_{CC}$ on its output terminal, then it carries a current $I_2=K_2I_E$. The current $I_2$ charges capacitor 6 by current $I_C$, and outputs current $I_{CC}$ to the signal generation means 8: $I_2=I_C+I_{CC}$. When the input voltage $V_E$ is less than $V_{CC}$, the amplifier blocks. Consequently, the current $I_2$ switches between values $K_2I_E$ and 0, depending on whether VE is greater than or less than $V_{CC}$.

The input voltage $V_E$ of the amplifier 12 follows the voltage $V_L$ of line 1 except for the resistive drop $I_E$ ($K_0R_0+K_1R_1+K_2R_2$), which is consequently within a few hundred millivolts. Therefore, the amplifier 12 operates like a rectifier. It outputs current on positive peaks and is blocked on negative peaks, with a current limited by $K_2I_E$. The maximum current of the amplifier 12 is proportional to current $I_E$ and therefore to $I_L$. That is, the currents at input terminal E and the output terminal S, respectively.

Amplifiers 10 and 11 filter harmonics generated by the amplifier-rectifier 12. The amplifier 11 imposes current $K_1I_E$ in resistance 20. Its current $I_1$ originates from the ground and is therefore equal to:

$$I_1 = K_1 I_E - I_2.$$

Therefore, this is a pulsed current, between $K_1$ and $I_E$ (for $I_2=0$) and ($K_1-K_2$) $I_E$ (for $I_2=K_2I_E$). Thus, the harmonics generated by the amplifier 12 are shunted from the ground through amplifier 11 (due to the fact that this amplifier is connected as a follower), and the current returned to the line is $K_1I_E$, the image of the input current $I_E$.

Preferably, $K_1-K_2$ is chosen to be sufficiently large such that the amplifier 11 current $I_1$ is sufficient to provide stability and the required gain-bandwidth product. However, $K_1-K_2$ should not be too high to maximize the fraction of the line current output to the power supply $V_{CC}$. An order of magnitude for the minimum current $I_1$ from amplifier 11 is, for example, 1/10 of the line current, which for a minimum line current of about 6 mA corresponds to 600 µA in the amplifier 11. This makes it possible to obtain the required gain-bandwidth product.

Since the gain-bandwidth product from amplifier 11 is necessarily limited, there is a residue remaining in resistance 20 corresponding to the differentiation of the pulsed current from amplifier 11. In some applications, this residue cannot give a sufficient harmonic ratio. In this case, the third amplifier 10 is installed in cascade with amplifier 11. Amplifier 10 imposes the current KOIE in resistance 16. Its current $I_0$ is shunted to ground and is therefore equal to:

$$I_0=K_0I_E-K_1I_E=(K_0-K_1)I_E.$$

This current is constant and no longer includes switching. With the slight exception that the very low residue of differentiation due to amplifier 11 remains. This residue is then shunted to the ground of amplifier 10 (because amplifier 10 is installed as a voltage follower), and is not sent to resistance 16.

With this circuit, the harmonic ratio obtained is very satisfactory. This circuit could be made by using amplifiers, for example, with a gain-bandwidth product exceeding 10 MHz, and an open loop gain exceeding 60 dB. This type of circuit provides a linear signal on line 1. A harmonic ratio of less than −100 dB can thus be obtained on the line.

The various significant currents are indexed on the line current $I_L$ by the ratios of the resistances $K_0$, $K_1$, $K_2$ which can be very precise in an integrated circuit production.

The following formulas are obtained:

current amplifier gain: $I_L/I_E=K_0+1=40$, current absorbed by amplifier 10: $I_L(K_0-K_1)/(K_0+1)$ (this current is positive if $K_0>K_1$), maximum current in amplifier 11: $I_LK_1/(K_0+1)$, minimum current in amplifier 11: $I_L(K_1-K_2)/(K_0+1)$ (this current is positive if $K_1>K_2$), maximum current absorbed by amplifier 12: $I_LK_2/(K_0+1)$, minimum current absorbed by amplifier 12: 0

With $R_0=R_1=R_2=10\Omega$, $K_0=39$, $K_1=36$, $K_2=32$, we obtain:

$I_L/I_E=40$, $I_L(K_0-K_1)/(K_0+1)=1/10$ $I_L$, $I_LK_1/(K_0+1)=9/10I_L$, $I_L(K_1-$ $K_2)/(K_0+1)=1/10I_L$, $I_LK_2/(K_0+1)=$ $8/10I_L$ (80% of the line current is assigned to the power supply $V_{CC}$).

A circuit with only two amplifiers, amplifier 12 and amplifier 11, can obtain a harmonic ratio of close to −80 dB, which is already very good and is quite suitable for many telephone type applications. In this type of circuit, the two amplifiers 11, 12 are still connected in cascade, each being connected as a voltage follower. The amplifier 12 output current is subtracted from the amplifier 11 output current, and the amplifier 11 output current is taken from line 1. Amplifier 11 always includes an input resistance 18 ($R'_1$) and an output resistance 20 ($R_1$) connected to output S.

The amplifier 12 comprises an input resistance 22 ($R'_2$) and an output resistance 24 ($R_2$) The current gains $K_1$, $K_2$ on each of these amplifiers are determined by the ratios $R'_1/R_1$ and $R'_2/R_2$, respectively. The amplifier 11 absorbs the amount by which its output current exceeds the output current from amplifier 12 and shunts it to the ground. The entire output current from amplifier 12 is applied to terminal $V_{CC}$. The current gain of the current amplifier circuit remains constant, and is determined by the current gain of amplifier 11 (in this case practically equal to it). The amplifier 12 always operates intermittently (it operates as a rectifier), whereas amplifier 11 operates continuously.

Here again, the various significant currents are indexed on the line current $I_L$ in the ratios of the resistances $K_1$, $K_2$, which may be very precise in producing integrated circuits.

The following formulas are applicable:

current gain of amplifier 11: $I_L/I_E=K_1+1$, minimum current absorbed by amplifier 11: $I_L(K_1-K_2)/(K_1+1)$, maximum current absorbed by amplifier 11: $I_LK_1/(K_1+1)$, maximum current in amplifier 12: $I_LK_2/(K_1+1)$, minimum current in amplifier 12: 0 A As an example, $K_1=39$, $K_2=35$, $R_1=R_2=10\Omega$, giving: $I_L/I_L=40$, $I_L(K_1-K_2)/(K_1+1)=1/10I_L$, $I_LK_1/(K_1+1)=39/40I_L$, $I_LK_2/(K_1+1)\approx 0.875I_L$ (87.5% of the line current is therefore assigned to power supply $V_{CC}$).

However, this type of circuit with two amplifiers is not sufficient for V.34 MODEM type applications, in which the harmonic content must be less than −80 dB (guaranteed in the worse case), or for U interface type applications for which higher distortions can be accepted, but for which the pass bandwidth is also higher. In this case, three amplifiers 10, 11 and 12 are used and operated as described above.

For example, amplifiers used to make the circuit according to the invention described above may have gain-bandwidth products greater than or equal to 10 MHz and open loop gains greater than or equal to 60 dB which can be produced with no special difficulty. These amplifiers preferably also have a very low internal consumption, to avoid taking line current at the expense of the power supply $V_{CC}$, $I_{CC}$, and also have the lowest possible waste current to enable operation at the lowest possible line voltages.

Figure 3:
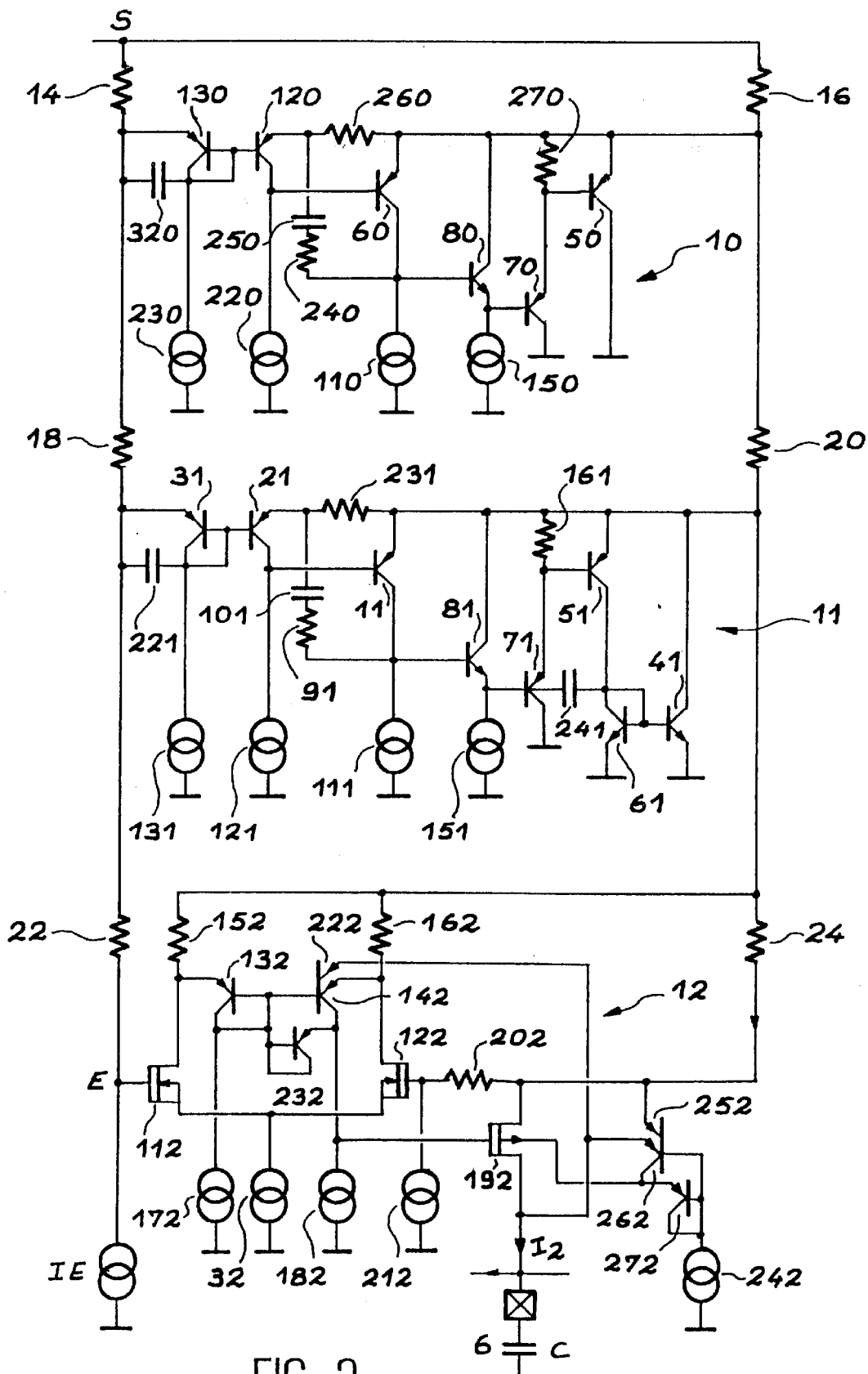
FIG. 3 represents an embodiment of a device according to the invention.

As described below, the invention (FIG. 3) provides an embodiment of these amplifiers capable of obtaining an internal consumption on the order of a few hundred µA for amplifiers 10, 11 and 12, and a waste voltage to ground of less than 2 V. FIG. 3 shows a detailed view of one embodiment of the previous circuit, and particularly for each of the amplifiers. The amplifiers 10 and 11 are connected as voltage followers on resistances 16 and 20, so that current sources servo-controlled to the input current $I_E$ can be made. The minimum total voltage drop between the positive power supply and ground is on the order of 1.8 V. The length of the line on which the circuit can perform its function is higher when the minimum operating voltage is lower.

With these characteristics, a circuit can be obtained with very good linearity. In other words, amplifiers 10 and 11 can filter harmonics generated by the amplifier-rectifier 12, and a circuit can be obtained in which the lowest possible line voltage can be used.

In the embodiment shown in FIG. 3, the amplifier-rectifier 12 comprises a differential NMOS amplifier 112–122 (for example, with W/L=100 $\mu$m/2 $\mu$m). The sources of transistors 112 and 122 are coupled through a current source 32, whereas the drains of these transistors are coupled to a PNP differential amplifier 132–142 through resistances 152 and 162. The differential amplifier 132–142 is thus controlled by the emitters, and the differential signal is transformed to a simple signal on the collector of transistor 142 due to transistor 132 being connected as a diode.

The differential amplifier 132–142 is biased by two equal current sources 172 and 182. The signal is input to the large dimension gate of the PMOS transistor 192, for which the source charged through resistance 24 forms the output. This output follows the input voltage E (gate voltage of transistor 112) by loopback onto the gate of transistor 122, when transistor 232 is conducting. The current $I_2$ from transistor 192 then supplies the $V_{CC}$ terminal through the drain.

The resistance 202 and the current source 212 compensate for offset voltages due to non-zero input currents of amplifiers 10 and 11. When the voltage VE becomes less than the voltage $V_{CC}$ on negative peaks of the line voltage, transistor 192 is blocked but its body bias is done correctly since the source and drain are swapped. Transistor 192 is blocked by the PNP transistor 222, which blocks transistors 132 and 142. The gate of transistor 192 is thus biased at $V_{CC}$ (up to its saturation voltage).

The PNP transistor 232 installed as a diode has the role of limiting the degree of saturation of transistor 222. This limits its emitter current, and avoids consumption from the terminal $V_{CC}$. The transistor 192 body is biased by the current source 242 and by the two PNP transistors 252 and 262, the emitters of which are connected to the drain and source electrodes of transistor 192 and the collectors of which are connected to the body of transistor 192. Thus, the transistor 262 or 252 for which the emitter voltage is highest will be biased by the base current from source 242, biasing the transistor 192 body at the same voltage (up to its saturation voltage).

The PNP transistor 272 installed as a diode limits the degree of saturation of transistors 252 or 262, thus limiting emitter reverse currents. The PNP transistors are preferably of the lateral type, to maintain high reverse base/emitter voltages.

The sizing of transistor 192 (for example W/L=1000 $\mu$m/2 $\mu$m) is chosen to be sufficient to provide the average current $I_{CC}$ with the lowest possible line voltage. Typically, for example, 3.5 V at the circuit terminals. For example, the following characteristics could be used:

| | | |
|---|---|---|
| $I_{172} = 1$ $\mu$A | $R_{152} = 100$ k$\Omega = R_{162}$ | $R_{202} = 1160\Omega$ |
| $I_{32} = 2$ $\mu$A | $I_{242} = 1$ $\mu$A | $I_{212} = 30$ $\mu$A |

Amplifier 11 is composed of the PNP differential amplifier 21–31 with inputs on the emitters. It is biased by equal current sources 131 and 121 and is followed by the PNP transistor 141 connected with a common emitter and biased by the current source 111. These two stages provide the voltage gain.

The current gain is given by the voltage follower made up of transistors 81, 71, 51, 61, 41, which absorbs the 100 mA maximum line current. This voltage follower consists of three transistors 81, 71, 51 connected with follower emitter.

The current of transistor 51 is amplified by the NPN mirror (with gain 100) composed of transistors 61, 41. The input on the transistor 31 emitter consumes current output by source 131, which creates a resistive drop across the input resistances 14 and 18. These drops are compensated by an identical drop across resistance 231 ($R_{231}=2R_0$ ($K_0$+1)+ $K_1R_1$). The RC network, consisting of resistance 91 and capacitance 101, ensures the stability of the feedback loop. The capacitance 221 short circuits diode 31 at high frequencies. The capacitance 241 stabilizes the local loop of the current amplifier follower.

It may be noted that the maximum voltage inserted by this amplifier consists of adding the two base/emitter DC voltages (from transistors 51 and 71) and the waste voltage from the current source 151 (which may be less than 0.4 V). Typically, a total waste voltage is on the order of 1.8 V. For example, the following characteristics could be used:

| | |
|---|---|
| $I_{131} = I_{121} = 30$ $\mu$A | $I_{151} = 15$ $\mu$A |
| $I_{111} = 60$ $\mu$A | $C_{221} = 5$ pF $= C_{241}$ |
| $C_{101} = 4.2$ pF | $R_{231} = 1160\Omega$ |
| $R_{91} = 300\Omega$ | $R_{161} = 20$k$\Omega$ |

Amplifier 10 is identical to amplifier 11, except for the current amplifier follower which does not act like the NPN current mirror 61, 41 (with gain 100). The amplifier 10 current is only a fraction of the line current $I_L$ ($\frac{1}{10}$ in the example given above). The input on the transistor 130 emitter consumes current output by source 230, which creates a resistive drop across the input resistance 14. This drop is compensated by an identical drop across resistance 260 ($R_{260}=2R_0$ ($K_0$+1)).

For example, the following characteristics may be used:

| | |
|---|---|
| $I_{230} = I_{220} = 30$ $\mu$A | $C_{250} = 2$ pF |
| $I_{150} = 15$ $\mu$A | $R_{260} = 800\Omega$ |
| $I_{110} = 60$ $\mu$A | $R_{270} = 20$k$\Omega$ |
| $R_{240} = 330\Omega$ | $C_{320} = 5$ pF |

Figure 4:
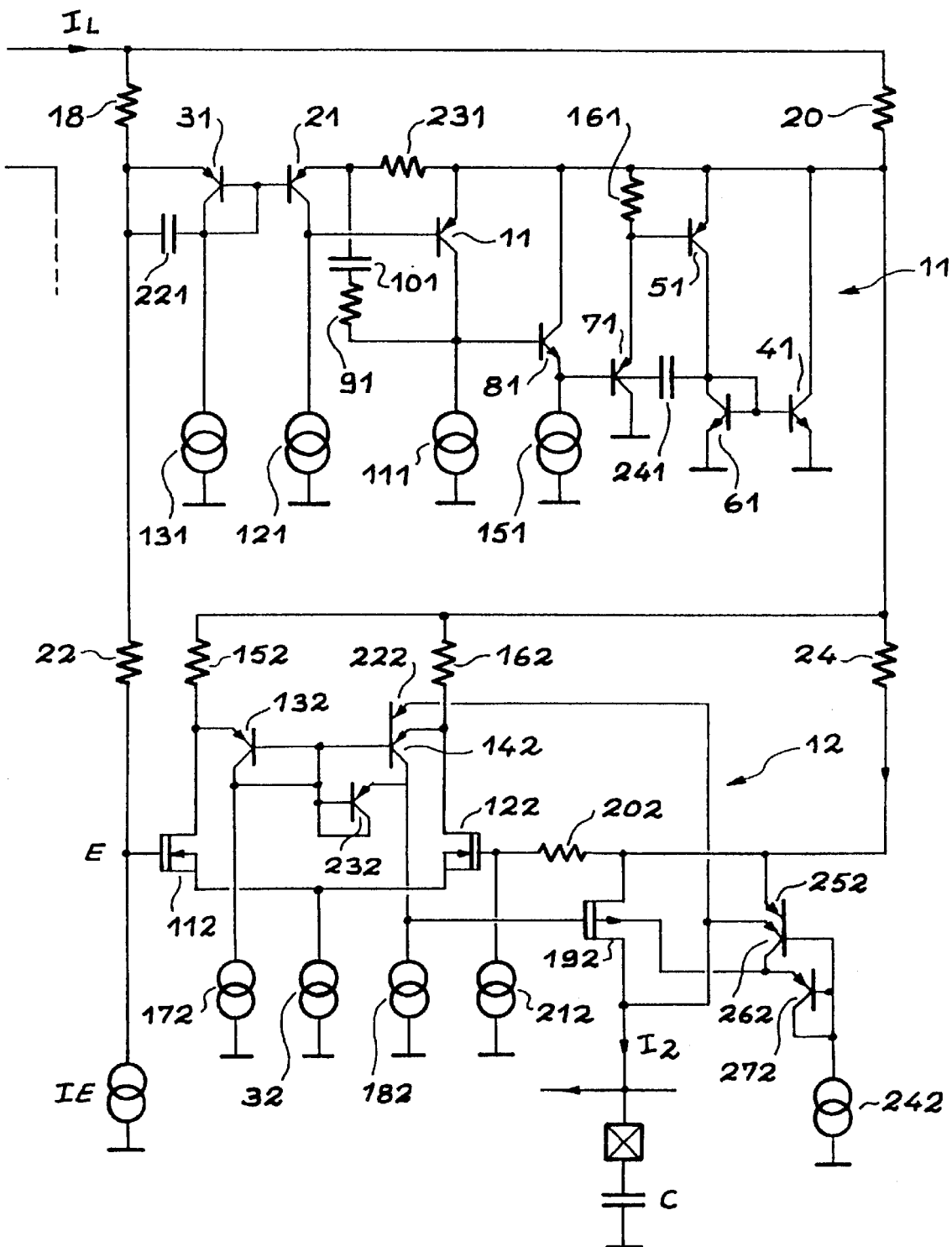
FIG. 4 represents another embodiment of a device according to the invention.

The embodiment in FIG. 4 is applicable to the case in which only two stages are installed in cascade. In this case, amplifiers 11 and 12 remain and amplifier 10 is eliminated. This circuit is sufficient when less severe distortion ratios are imposed. For example, with the given characteristics, a distortion ratio of the order of −78 dB is obtained in the system shown in FIG. 4 (largely sufficient for applications without MODEM functions), whereas the additional stage 10 (as shown in FIG. 3) can give a distortion ratio of better than −100 dB.

Numeric references in FIG. 4 identical to those in FIG. 3 refer to identical elements, with the same characteristics as described above. In the two embodiments described above (with reference to FIGS. 3 and 4) and in the case of a low DC line voltage, the voltage at the terminals of the integrated circuit is reduced to a low value, i. e. , 2.4 V, on negative peaks. The DC line voltage corresponds, for example, to 3.53 V at the integrated circuit terminals, on which a modulation can be superposed. A superposed modulation, for example, is a V.34 modulation for which the peak value may reach 1.1 V.

According to the invention, the power supply voltage $V_{CC}$ remains close to the average value of the line voltage $V_L$ (i. e., 3.5 V), which makes operation of means 8 (FIG. 1) outputting the integrated circuit signal and powered by $V_{CC}$, much easier. It would even be possible to consider operation, for example in V.34 mode, with voltages at the integrated circuit terminals even lower than 3.5 V. The capability of the circuit to operate at low voltages makes it compatible with use on long telephone lines (i. e., 5–8 km).

That which is claimed is:

1. A current amplifying device comprising:
   a first amplifier providing an output current; and
   a second amplifier connected in cascade and as voltage follower to the first amplifier, wherein an output current from the second amplifier is subtracted from the output current provided by the first amplifier, and the second amplifier operates as a rectifier.

2. A current amplifying device according to claim 1, further comprising:
   a third amplifier connected as a voltage follower to the first and second amplifiers, wherein the output current from the first amplifier is subtracted from an output current of the third amplifier.

3. A current amplifying device according to claim 2, wherein the third amplifier comprises:
   an input resistance $R'_0$; and
   an output resistance $R_0$, wherein a current gain of the third amplifier is determined by the ratio $R'_0/R_0$.

4. A current amplifying device according to claim 3, comprising:
   an input terminal; and
   an output terminal, wherein the input resistance $R'_0$ and the output resistance $R_0$ of the third amplifier connected to the output terminal.

5. A current amplifying device according to claim 3, wherein the ratio $R'_0/R_0$ between the input resistance $R'_0$ and the output resistance $R_0$ of the third amplifier determines a current gain of said current amplifying device.

6. A current amplifying device according to claim 1, wherein the first amplifier comprises:
   an input resistance $R'_1$; and
   an output resistance $R_1$, wherein a current gain of the first amplifier is determined by the ratio $R'_1/R_1$.

7. A current amplifying device according to claim 6, wherein the second amplifier comprises:
   an input resistance $R'_2$ connected in series with the input resistance $R'_1$; and
   an output resistance $R_2$ connected in series with the output resistance $R_1$, wherein a current gain of the second amplifier is determined by the ratio $R'_2/R_2$.

8. A current amplifying device according to claim 7, comprising:
   an input terminal; and
   an output terminal, wherein the input resistance $R'_2$ and the output resistance $R_2$ of the second amplifier are connected to the output terminal.

9. A current amplifying device according to claim 6, comprising:
   an input terminal; and
   an output terminal, wherein the input resistance $R'_1$ and the output resistance $R_1$ of the first amplifier are connected to the output terminal.

10. A current amplifying device according to claim 6, wherein the ratio $R'_1/R_1$ between the input resistance $R'_1$ and the output resistance $R_1$ of the first amplifier determines a current gain for said current amplifying device.

11. A current amplifying device according to claim 1, wherein each amplifier has a gain-bandwidth product exceeding 10 MHz and an open loop gain exceeding 60 dB.

12. A current amplifying device according to claim 1, wherein each amplifier has a minimum operating voltage in a range of about 1.5 V and 4 V.

13. A current amplifying device comprising:
   a first current amplifier;
   a second current amplifier; and
   a third current amplifier, each amplifier connected in cascade and connected as a voltage follower, and each amplifier has an input resistance $R'_1$, $R'_2$, $R'_0$ and an output resistance $R_1$, $R_2$, $R_0$, the input resistances are connected in series and the output resistances are connected in series, wherein the current gains of the first, second and third amplifiers are determined by the ratios $R'_1/R_1$, $R'_2/R_2$ and $R'_0/R_0$, respectively, the three amplifiers are connected such that the current from the second amplifier passes through its output resistance $R_2$, and is subtracted from the current passing through the output resistance $R_1$ of the first amplifier, and the current passing through the output resistance $R_1$ of the first amplifier is subtracted from the current passing through the output resistance $R_0$ of the third amplifier, and the second amplifier operates as a rectifying amplifier, and the current gain of said current amplifying device is determined by the current gain of the third amplifier.

14. A current amplifying device according to claim 13, wherein each amplifier has a gain-bandwidth product exceeding 10 MHz and an open loop gain exceeding 60 dB.

15. A current amplifying device according to claim 13, wherein each amplifier has a minimum operating voltage in a range of about 1.5 V and 4 V.

16. A current amplifying device according to claim 13, further comprising:
   a MOS transistor through which the second amplifier applies output current to a power supply terminal;
   means for blocking the MOS transistor and operating the second amplifier as a rectifier;
   a differential amplifier having an output which controls a gate of the MOS transistor gate; and
   a source of the MOS transistor being connected to an input of the differential amplifier.

17. A current amplifying device according to claim 16, further comprises:
   means for biasing the MOS transistor body at the source when the source and drain electrodes are swapped subsequent to polarity inversions due to operation as a rectifier.

18. A current amplifying device according to claim 17, further comprising:
   a power supply terminal through which the second amplifier shunts output current through the MOS transistor;
   a differential amplifier followed by another differential amplifier having an output which controls the gate of the MOS transistor;
   a feedback input of the differential amplifier through which the source of MOS transistor is connected;
   means for blocking the MOS transistor and operating the second amplifier as a rectifier; and
   means for biasing the MOS transistor body when the source and drain electrodes are swapped following polarity inversions due to operation as a rectifier.

19. A current amplifying device according to claim 16, wherein the first amplifier and the third amplifier, further comprises a differential amplifier, a transistor connected as a common emitter, and a voltage follower device.

20. A current amplifying device comprising:

a first current amplifier having an input resistance $R'_1$ and an output resistance $R_1$, wherein a current gain of the first amplifier is determined by the ratio $R'_1/R_1$, the first amplifier providing an output current;

a second current amplifier connected in cascade and as a voltage follower to the first current amplifier, said second current amplifier comprising an input resistance $R'_2$ connected in series with the input resistance $R'_1$, and an output resistance $R_2$ connected in series with the output resistance $R_1$, wherein a current gain of the second amplifier is determined by the ratio $R'_2/R_2$;

said first and second amplifiers being connected such that the current from the second amplifier passes through the output resistance $R'_2$ and is subtracted from the current from the first amplifier passing through the output resistance $R_1$, and the second amplifier operates as a rectifier amplifier; and a current gain of the current amplifying device being determined by the current gain of the first amplifier.

21. A current amplifying device according to claim 20, further comprising:

a MOS transistor through which the second amplifier applies output current to a power supply terminal;

means for blocking the MOS transistor making the second amplifier operate as a rectifier;

a differential amplifier having an output which controls the MOS transistor gate; and a source of the MOS transistor being connected to an input of the differential amplifier.

22. A current amplifying device according to claim 21, further comprises:

means for biasing the MOS transistor body at the source when its source and drain electrodes are swapped subsequent to polarity inversions due to operation as a rectifier.

23. A current amplifying device according to claim 20, wherein each amplifier has a gain-bandwidth product exceeding 10 MHz and an open loop gain exceeding 60 dB.

24. A current amplifying device according to claim 20, wherein each amplifier has a minimum operating voltage in a range or about 1.5 V and 4 V.

25. A telephone installation device comprising:

a current amplifying device connected to a telephone line for taking electrical energy from the telephone line to power logical and analog functions for processing MODEM transmissions and reception signals, said current amplifying device comprising:

a first amplifier providing an output current; and a second amplifier connected in cascade and as voltage follower to the first amplifier, wherein output current from the second amplifier is subtracted from the output current provided by the first amplifier, and the second amplifier operates as a rectifier.

26. A telephone installation device according to claim 25, further comprising:

a third amplifier connected as a voltage follower to the first and second amplifiers, wherein an output current from the first amplifier is subtracted from an output current of the third amplifier.

27. A telephone installation device according to claim 26, wherein the third amplifier comprises:

an input resistance $R'_0$; and an output resistance $R_0$, wherein a current gain of the third amplifier is determined by the ratio $R'_0/R_0$.

28. A telephone installation device according to claim 27, comprising:

an input terminal; and an output terminal, wherein the input resistance $R'_0$ and the output resistance $R_0$ of the third amplifier is connected to the output terminal.

29. A telephone installation device according to claim 27, wherein the ratio $R'_0/R_0$ between the input resistance $R'_0$ and the output resistance $R_0$ of the third amplifier determines a current gain of said current amplifying device.

30. A telephone installation device according to claim 25, wherein the first amplifier comprises:

an input resistance $R'_1$; and an output resistance $R_1$, wherein a current gain of the first amplifier is determined by the ratio $R'_1/R_1$.

31. A telephone installation device according to claim 30, wherein the second amplifier comprises:

an input resistance $R'_2$ connected in series with the input resistance $R'_1$; and an output resistance $R_2$ connected in series with the output resistance $R_1$, wherein a current gain of the second amplifier is determined by the ratio $R'_2/R_2$.

32. A telephone installation device according to claim 31, comprising:

an input terminal; and an output terminal, wherein the input resistance $R'_2$ and the output resistance $R_2$ of the second amplifier is connected to the output terminal.

33. A telephone installation device according to claim 30, comprising:

an input terminal; and an output terminal, wherein the input resistance $R'_1$ and the output resistance $R_1$ of the first amplifier is connected to the output terminal.

34. A telephone installation device according to claim 30, wherein the ratio $R'_1/R_1$ of the input resistance $R'_1$ and the output resistance $R_1$ of the first amplifier determines a current gain for said current amplifying device.

35. A telephone installation device according to claim 25, wherein each amplifier has a gain-bandwidth product exceeding 10 MHz and an open loop gain exceeding 60 dB.

36. A telephone installation device according to claim 25, wherein each amplifier has a minimum operating voltage in a range of about 1.5 V and 4 V.

* * * * *

UNITED STATES PATENT AND TRADEMARK OFFICE
CERTIFICATE OF CORRECTION

PATENT NO.   : 6,470,084 B1
DATED        : October 22, 2002
INVENTOR(S)  : Francois Van Zanten It is certified that error appears in the above-identified patent and that said Letters Patent is hereby corrected as shown below:

Column 5,
Line 21, delete "KOIE" insert -- $K_OI_E$ --

Column 7,
Line 23, delete "VE" insert -- $V_E$ --

Signed and Sealed this

Eighteenth Day of March, 2003

JAMES E. ROGAN
*Director of the United States Patent and Trademark Office*